(12) United States Patent
Herbsommer et al.

(10) Patent No.: US 10,754,302 B2
(45) Date of Patent: Aug. 25, 2020

(54) MOLECULAR ATOMIC CLOCK WITH WAVE PROPAGATING ROTATIONAL SPECTROSCOPY CELL

(71) Applicant: Texas Instruments Incorporated, Dallas, TX (US)

(72) Inventors: Juan Alejandro Herbsommer, Allen, TX (US); Argyrios Dellis, Dallas, TX (US); Adam Joseph Fruehling, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/234,492

(22) Filed: Dec. 27, 2018

(65) Prior Publication Data

US 2019/0204786 A1 Jul. 4, 2019

Related U.S. Application Data

(60) Provisional application No. 62/612,074, filed on Dec. 29, 2017.

(51) Int. Cl.
| | |
|---|---|
| *H03L 7/26* | (2006.01) |
| *H03B 17/00* | (2006.01) |
| *G04F 5/14* | (2006.01) |
| *H01P 5/16* | (2006.01) |
| *H01P 5/18* | (2006.01) |

(52) U.S. Cl.
CPC ............... *G04F 5/14* (2013.01); *H03B 17/00* (2013.01); *H03L 7/26* (2013.01); *H01P 5/16* (2013.01); *H01P 5/185* (2013.01)

(58) Field of Classification Search
CPC .......................................................... G04F 5/14; G04F 5/145; H03B 17/00; H03L 7/26
USPC ..................................................... 331/3, 94.1
See application file for complete search history.

(56) References Cited

U.S. PATENT DOCUMENTS 2,602,835 A * 7/1952 Hershberger ........ G01N 24/008
324/636
2,602,897 A * 7/1952 Norton ...................... H03L 7/26
331/3
(Continued)

FOREIGN PATENT DOCUMENTS

WO 2015108439 A1 7/2015

OTHER PUBLICATIONS

International Search Report for PCT/US2018/068174 dated Apr. 11, 2019.
(Continued)

*Primary Examiner* — Levi Gannon
(74) *Attorney, Agent, or Firm* — Michael A. Davis, Jr.; Charles A. Brill; Frank D. Cimino

(57) ABSTRACT

A clock apparatus, with: (i) a gas cell, including a cavity including a sealed interior for providing a signal waveguide; (ii) a first apparatus for providing a first electromagnetic wave to travel in the cavity and along a first direction; (iii) a second apparatus for providing a second electromagnetic wave to travel in the cavity and along a second direction opposite the first direction; (iv) a dipolar gas inside the sealed interior of the cavity; and (v) receiving apparatus for detecting an amount of energy in the second electromagnetic wave after the second electromagnetic wave passes through the dipolar gas.

20 Claims, 9 Drawing Sheets

(56) References Cited

U.S. PATENT DOCUMENTS

| | | | |
|---|---|---|---|
| 2,695,361 A * | 11/1954 | Norton | H03L 7/26 |
| | | | 331/3 |
| 2,762,871 A | 9/1956 | Dicke | |
| 2,811,644 A * | 10/1957 | Norton | H03L 7/26 |
| | | | 331/2 |
| 2,836,722 A | 5/1958 | Dicke et al. | |
| 4,943,955 A | 7/1990 | Rabian et al. | |
| 5,327,105 A | 7/1994 | Liberman et al. | |
| 5,657,340 A * | 8/1997 | Camparo | G04F 5/14 |
| | | | 250/251 |
| 9,553,597 B2 * | 1/2017 | Katori | G04F 5/14 |
| 2013/0003766 A1 | 1/2013 | Savchenkov et al. | |
| 2014/0028405 A1 | 1/2014 | Hong | |
| 2015/0028866 A1 | 1/2015 | Parsa et al. | |
| 2016/0291549 A1* | 10/2016 | Herbsommer | G01N 29/36 |
| 2017/0105276 A1* | 4/2017 | Kock | H05H 3/00 |
| 2018/0241407 A1* | 8/2018 | Hayashi | G04F 5/145 |

OTHER PUBLICATIONS

International Search Report for PCT/US2018/068178 dated Apr. 25, 2019.

\* cited by examiner

MOLECULAR ATOMIC CLOCK WITH WAVE PROPAGATING ROTATIONAL SPECTROSCOPY CELL

CROSS-REFERENCES TO RELATED APPLICATIONS

This application claims priority to, the benefit of the filing date of, and hereby incorporates herein by reference: U.S. Provisional Patent Application No. 62/612,074, entitled "Molecular Atomic Clock With Wave Propagating Rotational Spectroscopy Cell," filed Dec. 29, 2017.

This application is related to co-pending and co-assigned U.S. patent application Ser. No. 16/234,494, filed on even date, and entitled, "Molecular Atomic Clock With Wave Propagating Rotational Spectroscopy Cell."

STATEMENT REGARDING FEDERALLY SPONSORED RESEARCH OR DEVELOPMENT

Not Applicable.

BACKGROUND

The example embodiments relate to precision frequency clock signals generated from molecular rotational quantum response in a cell and, more particularly, to a system incorporating wave interrogation of the cell.

Precision clock signals, usable as a base frequency source either directly, or converted (e.g., divided down) to some multiple of a base frequency source, can be generated from various circuits and configurations. One precision clock signal example is an atomic clock, so named as its signal is produced in response to the natural and quantum response of atoms or molecules, to an excitation source. In one approach, such atoms are in the form of alkali metals stored in a chamber, where the excitation source can be one or more lasers directed to the cell and the response of the chamber atoms is detected by measuring the amount of laser energy (photons) that passes through the chamber as the laser frequency sweeps across a range. In another approach, such molecules are in the form of dipolar gases also stored in a chamber, where the excitation source is an electromagnetic wave propagating through the chamber and the response of the chamber atoms is detected by measuring the amount of electromagnetic energy that passes through the chamber as the energy source sweeps across a range.

Further to the above, an example of a millimeter wave atomic clock is described in U.S. Pat. No. 9,529,334 ("the '334 Patent"), issued Dec. 27, 2016, hereby incorporated fully herein by reference, and which is co-assigned to the same assignee as the present application. The '334 Patent illustrates, among various other things, an atomic clock apparatus including a sealed cavity storing a dipolar gas, with an electromagnetic entrance into which an electromagnetic wave (or field) enters near a first end of the cavity and an electromagnetic exit from which an electromagnetic wave exits near a second end of the cavity. The electromagnetic wave that so exits is measured to determine an amount of absorption by (or transmission through) the dipolar gas, with the measure indicative of the quantum response of the gas as a function of the wave frequency. The '334 Patent also discusses a selection of pressure for the cavity-sealed dipolar gas, noting that pressure reduction below a desired pressure would reduce the magnitude of the peak response transition, thereby degrading the ability to detect and track the quantum response of the dipolar gas.

While the prior art approaches described above can provide useful to quantum response detection, the present application provides alternatives to the prior art, as further detailed below.

SUMMARY

In an embodiment, there is a clock apparatus, comprising: (i) a gas cell, including a cavity including a sealed interior for providing a signal waveguide; (ii) a first apparatus for providing a first electromagnetic wave to travel in the cavity and along a first direction; (iii) a second apparatus for providing a second electromagnetic wave to travel in the cavity and along a second direction opposite the first direction; (iv) a dipolar gas inside the sealed interior of the cavity; and (v) receiving apparatus for detecting an amount of energy in the second electromagnetic wave after the second electromagnetic wave passes through the dipolar gas.

Numerous other inventive aspects are also disclosed and claimed.

DETAILED DESCRIPTION

Figure 1:
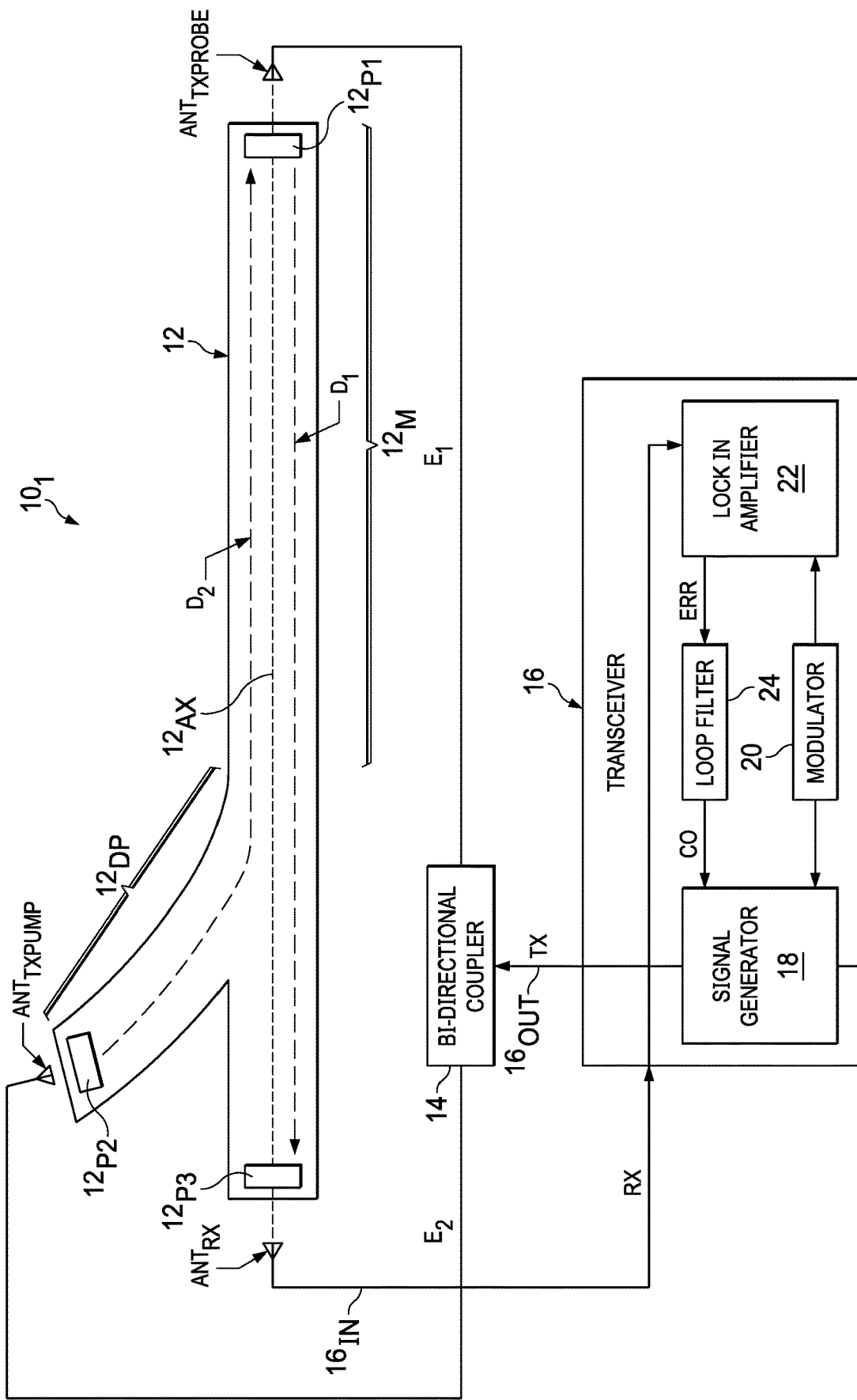
FIG. 1 illustrates a schematic diagram of an example embodiment clock system.

FIG. 1 illustrates a schematic diagram of an example embodiment clock system 101. Clock system 101 is understood in general with reference to three components, a gas cell 12, a bidirectional coupler 14, and a transceiver 16, where ultimately transceiver 16 provides a stable reference clock signal REFCLK in response to bidirectional electromagnetic interrogation of a dipolar gas in cell 12. Dipolar gas is preferred, as its electrical dipolar nature provides a detectable response to an interrogating electromagnetic wave, as further explored below. Various other additional details about these components, interactions between them, manners of construction, and the like are detailed in the remainder of this document.

Cell 12 is preferably formed in connection with an integrated circuit wafer, which can include multiple layers affixed relative to a semiconductor substrate (see, e.g., the incorporated by reference U.S. Pat. No. 9,529,334). In the illustration of FIG. 1, as well as in various subsequent figures, the shape depicted of cell 12 is intended to depict a generally top-down view, such as a planar cross-sectional view parallel to the plane generally defined by the substrate in which the gas storage cavity of cell 12 is formed. In general, cell 12 includes a sealed enclosure having an interior in which a gas is stored. More specifically, cell 12 stores a dipolar gas, such as water vapor ($H_2O$), $CH_3CN$, $HC_3N$, OCS, HCN, $NH_3$, and isotopes of these gases, or any other dipolar molecular gas, inside an enclosed cavity of the cell, the cavity being sealed by nature of shapes, layering, and the like relative to the semiconductor substrate and layers that combine to enclose the dipolar gas at a relatively low (e.g., 0.1 mbar) pressure. For reasons detailed below, however, the enclosed pressure can be other than the example provided, as an example embodiment affords additional beneficial results that are independent of, or minimally affected by, the sealed pressure of the dipolar gas. Cell 12 also preferably includes, or is lined along most of its interior surfaces with, a material to facilitate the interior as a signal waveguide, where such material may be, for example, a conductor or a dielectric. Also for reasons evident hereinbelow, preferably cell 12 includes a majority longitudinal length having a linear axis $12_{AX}$ and along which electromagnetic waves may travel, where the cross-sectional shape of cell 12 perpendicular to axis $12_{AX}$ may be square, rectangular, trapezoidal, or still other shapes. The dimensions of cell 12 may vary, where for example it may be 30 to 150 mm long, 30 to 50 mm wide, and 0.5 millimeter tall, where selecting these or comparable sizes are intended to match properties for efficient wave propagation given the frequency of the desired wave. Moreover, while the longitudinal shape is linear in FIG. 1 (and other figures), it also may bend or turn so as to form, for example, a meandering path. In various embodiments, cell 12 includes an additional cavity portion that departs away from the linear portion of axis $12_{AX}$, where in FIG. 1, this non-coaxial or non-co-linear departure is shown generally at $12_{DP}$.

Bidirectional coupler 14 provides structure, detailed later, for propagating electromagnetic waves in both directions along axis $12_{AX}$ of cell 12. Accordingly, in the example of FIG. 1, coupler 14 is connected to a probe antenna $ANT_{TXPROBE}$ and to a pump antenna $ANT_{TXPUMP}$. Probe antenna $ANT_{TXPROBE}$ is positioned proximate a first passage $12_{P1}$ of cell 12, so that electromagnetic energy from coupler 14 may be communicated to probe antenna $ANT_{TXPROBE}$ and then into first passage $12_{P1}$ as an entrance into cell 12 and thereby to pass in general in a first direction $D_1$ shown by a dashed arrow in FIG. 1. Note that the term passage in the context of first passage $12_{P1}$ is intended to suggest a signal communications pathway for passage of the electromagnetic signal, but not an open aperture to ambient per se that otherwise could cause the sealed dipolar gas in cell 12 to escape; accordingly, such a pathway may be formed in various fashions, such as by a glass layer as the upper surface of the sealed enclosure of the cell and providing an opening in the metal surround that is otherwise formed within the cell—in this manner, an electromagnetic signal may pass through the opening and glass into the interior of the cell, thereby reaching the dipolar gas sealed therein. Pump antenna $ANT_{TXPUMP}$ is positioned proximate a second passage $12_{P2}$ of cell 12, so that electromagnetic energy from coupler 14 may be communicated to pump antenna $ANT_{TXPUMP}$ and then into second passage $12_{P2}$ as an entrance into cell 12 and thereby to pass in general in a second direction $D_2$, also shown by a dashed arrow in FIG. 1. Accordingly, for a majority $12_M$ of the length along axis $12_{AX}$, the signals communicated by coupler 14 provide bidirectional interrogation of the dipolar gas in cell 12.

Transceiver 16, as its name suggests, is both for transmitting (TX) and receiving (RX) signals. Internally within transceiver 16 are illustrated four blocks 18, 20, 22, and 24, by way of example but not limitation, for accomplishing the transceiver and signal responsiveness described herein. In this regard, a signal generator 18 is connected, and is modulated by a modulator 20, to provide a base frequency controlled TX signal that, as detailed later, is swept across a particular frequency range from below to past the intrinsic quantum rotational state transition frequency for the dipolar gas in cell 12 (e.g., 183.31 GHz for water). Modulator 20 modulates the frequency of the interrogation signal provided by the signal generator 18. The modulation frequency ranges, for example, between 10 to 50 KHz. After the signal passes through the gas cell, it is received by a lock in amplifier 22, via an input $16_{IN}$ coupled to receive the RX signal from a receive antenna $ANT_{RX}$. Particularly, antenna $ANT_{RX}$ is positioned proximate a third passage $12_{P3}$ of cell 12, so that electromagnetic energy from along axis $12_{AX}$ may be communicated from passage $12_{P3}$, as an exit, to receive antenna $ANT_{RX}$ and then to transceiver 16 and, more particularly, to lock in amplifier 22. In general, lock in amplifier 22 uses the signal from the modulator 20 to measure the RX signal at the same modulation frequency provided by modulator 20. In this way, lock in amplifier 22 is able to reject noise outside the modulation frequency and thereby reduce the noise from the system.

In more detail, the TX signal may be a sinusoid, although other periodic oscillating signals also may be used, so long as such signal includes a Fourier component in the frequency of interest. The TX signal is connected, via an output $16_{OUT}$, to bidirectional coupler 14. Under feedback control, signal generator 18 also provides the ultimately-refined reference clock REFCLK. The RX signal represents an amount of the originally transmitted signal TX that passes through cell 12 and contains the information of the absorption of the dipolar gas at the quantum rotations transition frequency. In response, lock in amplifier 22 provides a signal that is the first derivative of the signal as it is swept in frequency. Consequently at the frequency corresponding to the quantum rotational molecular transition, the first derivative is zero and the error signal ERR is zero. At frequencies different from the quantum rotational transition, the signal ERR is not zero and provides a correction to the loop filter 24, allowing it to "lock" the clock to the quantum transition frequency. This apparatus also filters out noise as detected by reference to the modulation frequency provided by modulator 20. In one example, lock in amplifier 22 provides the error signal ERR as an in-phase output, and the error signal ERR is used as an input by a loop filter 24 (or controller circuit) for providing a control output signal CO to signal generator 18. As further detailed below, such feedback selectively adjusts the TX output signal frequency, following an initial sweep, to ultimately maintain this frequency at a peak absorption frequency of the dipolar molecular gas inside the sealed interior of cell 12, with that maintained frequency providing a stable output reference clock REFCLK. In some examples, the RF power of the TX and RX loop is controlled so as to avoid or mitigate stark shift effects (frequency shifts in response to quantum transition produced by the presence of an electric field).

Figure 2:
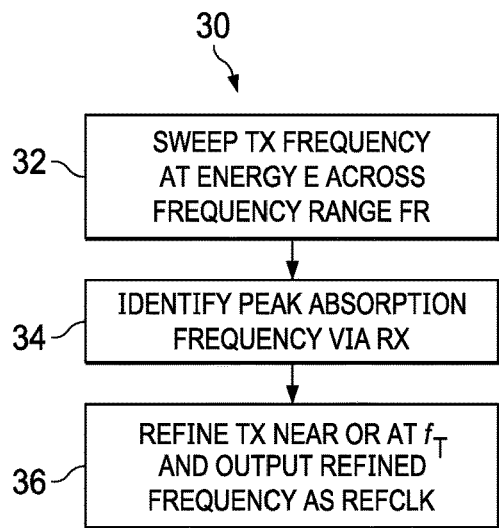
FIG. 2 illustrates a method of operation of the system of FIG. 1.

The overall operation of system $10_1$ is now described, in connection with the flow chart method 30 of FIG. 2. By way of introduction, note that method 30 is shown as a sequential flow process for sake of discussion, while in general the steps provide a feedback control and, accordingly, each step may actually occur in a time overlapping one or more of the other steps. In a step 32, transceiver 16 sweeps the modulated base frequency TX signal such that the base frequency is swept across an initial frequency range FR that is intended to include the intrinsic quantum rotational state transition frequency for the dipolar gas in cell 12. Thus, in the example where the dipolar gas is water, the range will include the intrinsic quantum rotational state transition frequency of 183.31 GHz for water, and could include, for example, a sweep from 183.28 GHz to 183.34 GHz. Thus, the TX signal delivers an energy E to bidirectional coupler 14, sweeping across this frequency range, so that the same frequency is simultaneously applied by both antennas $ANT_{TXPUMP}$ and $ANT_{TXPROBE}$, so as to achieve the bidirectional propagation along directions $D_1$ and $D_2$ introduced above. In addition, while the TX signal represents a certain amount of energy E, preferably coupler 14 couples a first amount $E_1$ of that energy to antenna $ANT_{TXPROBE}$ and a second amount $E_2$ of that energy (i.e., subject to possible signal loss $TX-E_1=E_2$) to antenna $ANT_{TXPUMP}$. Preferably $E_2>E_1$, where for example $E_2$ may be 90% of TX, leaving 10% of TX as $E_1$.

In step 34, transceiver 16 converges to, or locks in at, a Doppler free frequency $f_T$ at which peak absorption of the electromagnetic wave occurs in the dipolar gas sealed in cell 12, in response to the sweeping frequency from step 32 and the corresponding detected response. Particularly, steps 32 and 34 may essentially occur simultaneously, as during step 34, receive antenna $ANT_{RX}$ couples the RX signal, which occurs from the TX signal of step 32, to lock in amplifier 22. Lock in amplifier 22 also receives the modulation frequency from modulator 20, so that according to known lock in methodology, noise may be reduced from the received signal so as to detect the received energy corresponding to the base frequency TX signal that is input to cell 12 from signal generator 18. Further, lock in amplifier 22 (or associated circuitry) evaluates a derivative of the RX signal as the step 32 sweep occurs. Accordingly, as the RX signal is changing (in response to a quantum response in cell 12), the derivative is non-zero, whereas as the RX signal reaches a peak (maximum or minimum) the derivative approaches or is zero. This derivative determination provides an error signal ERR, connected as an output to loop filter 24, and as further explained below the error ERR signal is expected to reach zero at three different TX base frequencies.

In step 36, loop filter 24 provides a control signal CO to signal generator 18, so as to refine control of signal generator 18 to make adjustments in the frequency of TX to restrain or refine that frequency in a feedback look controlled manner to thereafter maintain the base frequency of TX at the center frequency among the three different TX base frequencies for which the error signal ERR is zero. This center frequency represents the frequency $f_T$ at which peak absorption occurs of the electromagnetic wave occurs in the cell dipolar gas. In this regard, note that loop filter 24 is preferably a proportional integral derivative (PID) circuit, with an output that sums values, multiplied times respective controlled parameters, corresponding to the three factors (i.e., proportional, integral, derivative) that give the PID circuit its name. Accordingly, the output of loop filter 24 facilitates a clock signal with good stability and reduces or eliminates the possibility of the signal generator creating a signal that oscillates around the around desired frequency. Accordingly, at this point, the TX signal should maintain a base frequency at or near the intrinsic transitional quantum frequency of the dipolar gas, and that same base frequency is output as the reference clock signal REFCLK, as may be used by other circuitry requiring a frequency-precise clock signal. Indeed, method 30 may be regarded as an ongoing loop running at selected (or all) times that the clock is operational and endeavoring to lock the clock at most or all instants where, once locked after an initial scan of steps 32 and 34, the loop continues to perform across a second frequency range that is smaller in bandwidth than the above-described step 32 initial frequency range FR, where the second frequency range is expected to still include the center frequency representing frequency $f_T$. In other words, the step 32 sweep and step 34 response detection can essentially repeat in step 36, but using a narrower bandwidth for more efficient refinement or maintenance of the base frequency at the peak absorption frequency $f_T$, as further illustrated hereinbelow.

Given the preceding, one skilled in the art will appreciate that system 101 facilitates electromagnetic interrogation of the dipolar gas within cell 12, by transmitting TX at varying (e.g., sweeping) frequencies within a defined band around a suspected quantum absorption frequency at which the transmission efficiency of cell 12 is minimal (absorption is maximal), and when the system detects a null or minima in transmission energy (or maximum in absorption), the TX output signal frequency is regulated to operate at the frequency so detected, thereby in response to the natural quantum behavior of the dipole. As a result, REFCLK, like that quantum behavior, is generally stable with respect to time (does not degrade or drift over time) and is largely independent of temperature and a number of other variables.

Having introduced system $10_1$ and certain of its components, certain observations are now provided in connection with the prior art and for contrast with the example embodiment benefits. First by way of introduction, the Allan deviation (which is the square root of the Allan variance) is a measure of frequency stability of clock signals (e.g., in clocks, oscillators, amplifiers), and in effect is a measure of frequency distribution over a number of samples—hence, the lower the Allan deviation measure, the lower the variance of distribution and the better the performance of the clock signal. Further, the Allan deviation is inversely proportional to both the quality factor (Q) and signal-to-noise ratio (SNR) of the frequency response curve, whether in the prior art, or transceiver 16 in an example embodiment, as it processes the received RX signal response to detect an absorption peak frequency; thus, by increasing one or both of the Q and SNR of the system, the Allan deviation measure is improved. Notably, the prior art can achieve certain improvement in the Allan deviation by reducing pressure within the cell which reduces the width of the transition caused by pressure broadening phenomena, as such an approach will improve Q only down to a certain pressure; however, for pressures below a certain value (e.g., 0.1 mbar), the width cannot be reduced further because of Doppler broadening which is independent of pressure and mostly dependent on the temperature of the gas. However pressure reduction reduces the number of molecules available for interrogation and so reducing the amplitude of the quantum transition signal. In summary an optimum pressure can be found (for water this pressure is approximately 0.1 mbar) where the SNR can be maximized by having the minimum transition width possible and the maximum amplitude possible.

As mentioned above, the prior art endeavors can be susceptible to Doppler broadening, which is an effect caused by the distribution of velocities of atoms/molecules, particularly in response to higher temperatures. Particularly, for atoms having velocities in a same direction as the direction of propagation of the electromagnetic wave, the Doppler effect will cause the transition of the dipolar molecules from the lower energy vibrational state to the higher energy vibrational state to occur when the frequency of the electromagnetic signal is lower than the frequency that corresponds to the energy difference of the two vibrational states (E=h f) (e.g., 183.31 GHz for water), and conversely, for atoms having velocities in an opposing direction as the prior art unidirectional signal, the Doppler effect will cause the rotational transition of those atoms to occur at an excitation frequency that is higher than the intrinsic quantum rotational state transition frequency for the dipole. Thus, the result of Doppler spreading is a wider spectral line when interrogating these atoms/molecules, which accordingly provides less accuracy in identifying a particular frequency of quantum transition.

Figure 3:
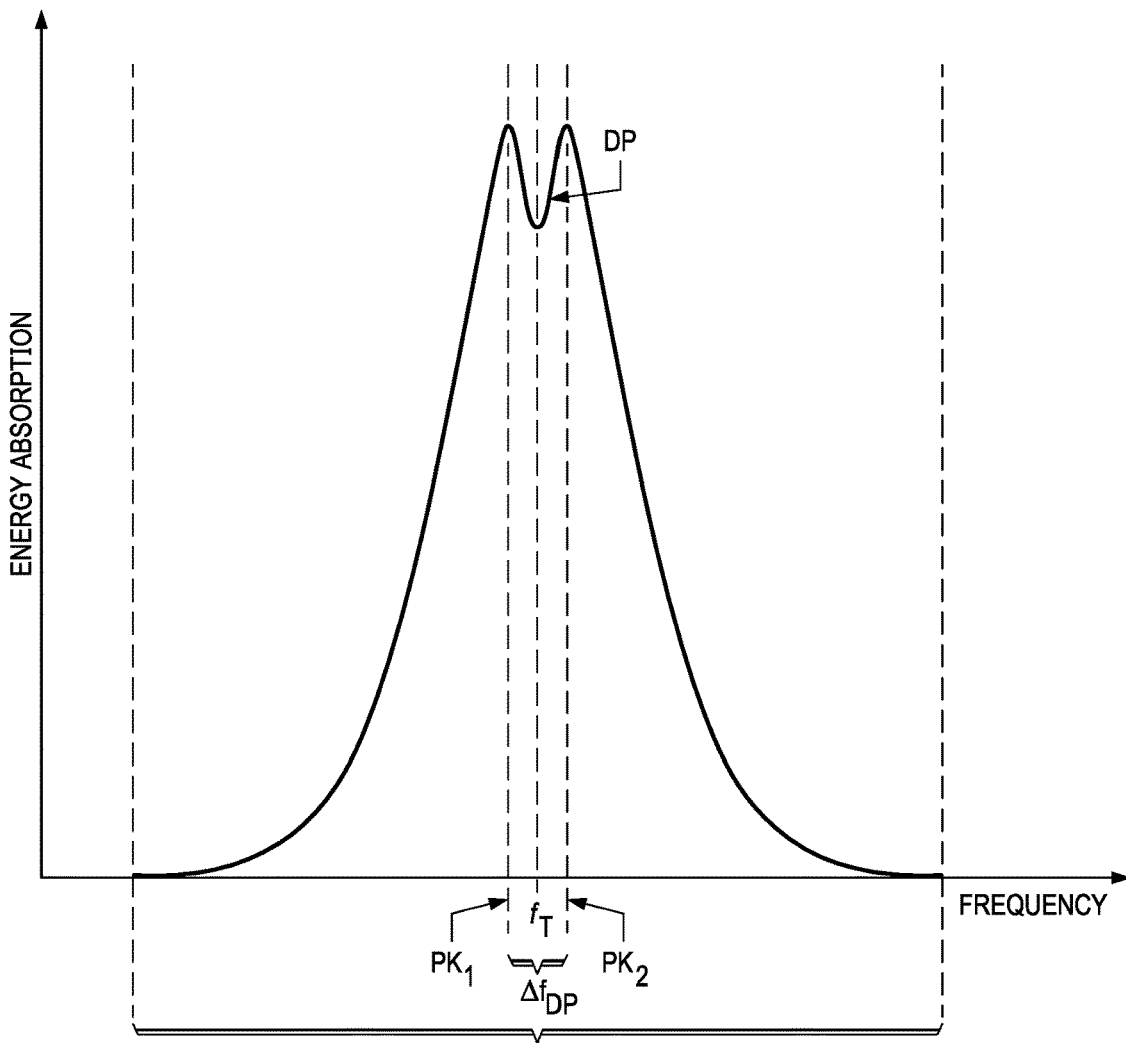
FIG. 3 illustrates a plot of the RX energy absorption signal in response to the energies E1 and E2 from the pump and probe of the system in FIG. 1.

Reference is now turned to the contrast of example embodiment benefits, particularly in connection with the prior art observations above and the example embodiment implementation of bidirectional signal paths along majority $12_M$ of cell 12, as further demonstrated by the plot of FIG. 3. Specifically, FIG. 3 illustrates a plot of the RX energy absorption by the gas in cell 12, in response to the energies $E_1$ and $E_2$ from the pump and probe TX signals, respectively, and as a function of frequency. Recall both the probe and pump are at the same frequency, and that frequency is swept across a range that is intended to include the intrinsic quantum rotational state transition frequency $f_T$ for the dipole (e.g., 183.31 GHz for water). In general, therefore, the sweeping of frequency may be low to high (or high to low), producing the response shape depicted in FIG. 3. Note that while FIG. 3 plots absorption, transmission energy is provided in the signal TX and detected in the signal RX, so a plot, normalized to a value of one, is essentially one minus the signal plot of FIG. 3. In any event, as the swept frequency approaches the intrinsic quantum rotational state transition frequency, the absorption of energy by the dipolar gas increases as shown (or the amount of energy transmitted through the cell decreases), and as detected in the RX signal, creates an absorption spectra that is flatter away from that intrinsic frequency and that ascends from both directions as the frequency sweep nears the dipolar gas intrinsic frequency. Additionally, as the intrinsic frequency is approached, a first peak $PK_1$ occurs which is shown as a maximum in terms of energy absorption and at a frequency below the Doppler free frequency $f_T$, and similarly above $f_T$ a second peak $PK_2$ occurs. As further detailed below, however, example embodiments are able to detect an additional peak as the Doppler free frequency $f_T$, between peaks $PK_1$ and $PK_2$.

Further regarding the FIG. 3 response, recall that an example embodiment provides one of the bidirectional TX signals at a higher energy than the other, where for sake of convention in other technologies the higher-energized signal is termed the pump. As a result, it is anticipated in connection with some example embodiments that most of the atoms interrogated by the higher-energized pump signal, at the appropriate quantum frequency, will be excited to an energy level higher than a lower energy (e.g., ground) state, while other of the atoms will remain at the lower energy state. Thus in response to the probe signal, the number of molecules that are in the ground state is significantly reduced because most of them have been excited to the excited state by the pump signal causing a decrease in the absorption profile. In addition, however, the bidirectional or counter-propagating nature of the probe and pump signals also reduces or eliminates the Doppler effect. Particularly, atoms at zero velocity experience do not have the Doppler effect, and are accordingly affected by the frequency aspect of both of the counter-propagating waves, where again the pump beam has depopulated a portion of the ground state to the higher energy state. As a result of the preceding, less of the ground state atoms remain at frequency $f_T$, so there are fewer atoms to absorb the probe energy and a corresponding drop in absorption, where such lack of absorption of that probe energy is evident in the resultant RX plot of FIG. 3, which includes a dip DP centered around at the intrinsic frequency $f_T$, the dip arising from the fewer low-energy atoms to absorb the probe signal. Thus, the example embodiment provides so-called Doppler-free spectroscopy, in that Doppler broadening is no longer an issue under this approach and the benefit in some embodiments may be independent of the gas pressure in cell 12. Note further that the frequency width $\Delta f_{DP}$, between peaks $PK_1$ and $PK_2$, DP is considerably less than the frequency width $\Delta f_O$ of the outer Gaussian ascending portions of the plot; hence, the Q relative to the frequency width $\Delta f_{DP}$ is considerably better than the Q relative to the frequency width $\Delta f_O$ of the outer ascending portions. Accordingly, the improved Q of the Doppler free architecture improves the Allan deviation of system 10 (and the other comparable systems described in this document).

Figure 4:
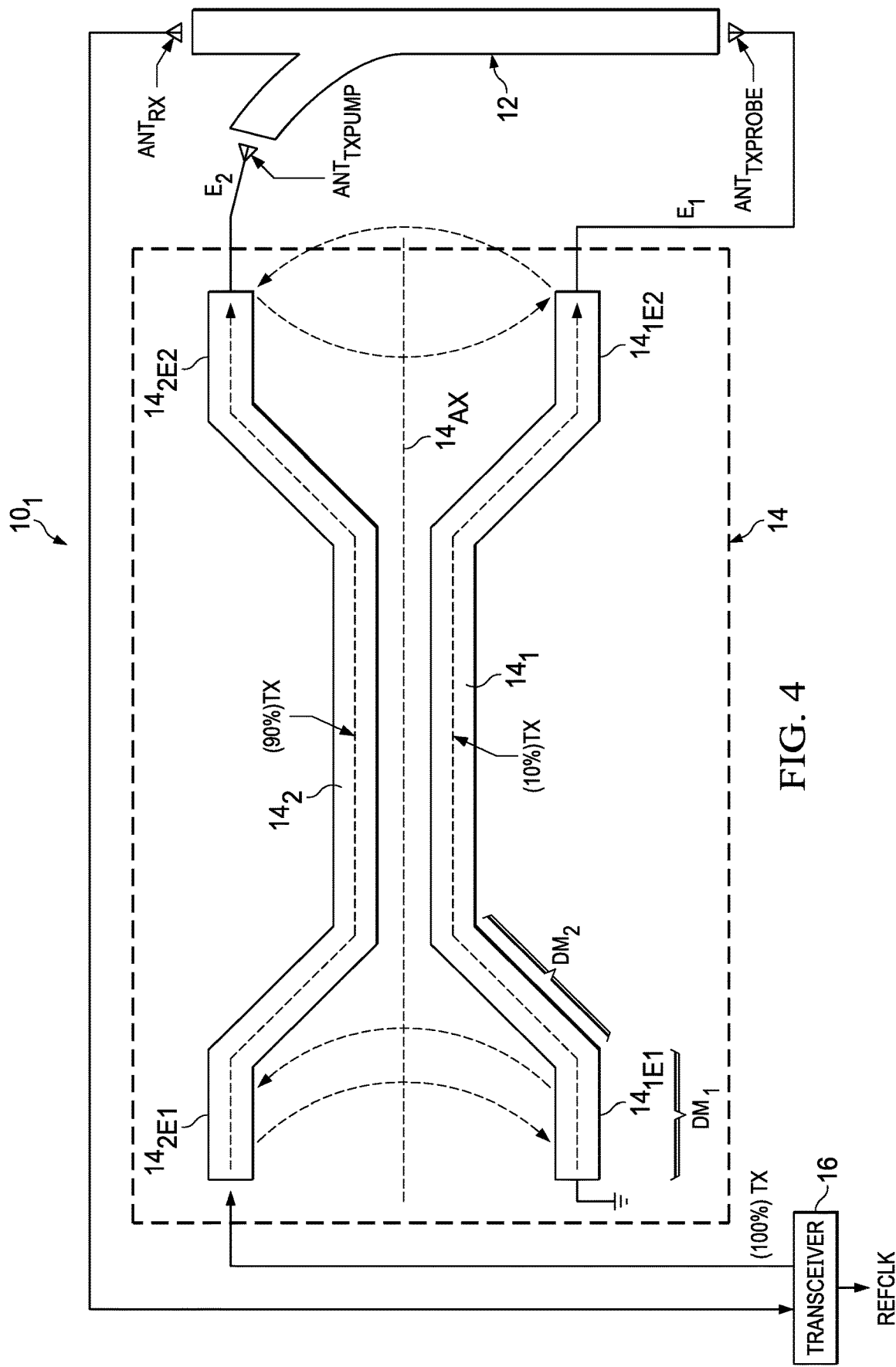
FIG. 4 again illustrates a schematic diagram of the FIG. 1 system with additional detail to a first example embodiment configuration for the bidirectional coupler.

FIG. 4 again illustrates a schematic diagram of system $10_1$, with additional detail provided for one example embodiment configuration for bidirectional coupler 14. While FIG. 4 illustrates blocks in certain aspects, the top-down spatial relationship may be illustrative of an example embodiment implementation in general in that cell 12, coupler 14, and transceiver 16 may be positioned relative to one another, or at least proximate one another, in connection with a semiconductor substrate and/or wafer. For example, cell 12 may be formed as part of layering affixed to, or part of, the semiconductor substrate, with an upper layer thereof having passages (not shown, but see FIG. 1, passages $12_{P1}$, $12_{P1}$, and $12_{P3}$) being penetrable by electromagnetic waves, such as by way of a glass layer having a conductive layer adjacent thereto and with apertures, corresponding to the passages, formed in the conductive layer. Further, coupler 14 is then formed proximate (e.g., within 5 millimeters) cell 12, being located as close as possible to reduce losses of the signal traveling from the directional coupler and cell 12. Coupler 14 may be formed by members (e.g., conductors, described below) applied (e.g., surface plated) to an upper surface of the above-mentioned glass layer that encloses the dipole-retaining sealed cavity of cell 12. Alternatively and as shown later in FIG. 8, coupler 14 may be coplanar with cell 12 or monolithically integrated into the same cavity that forms cell 12. Lastly, transceiver 16 can be formed as a separate integrated circuit, which is then conductively and mechanically affixed nearby coupler 14 and cell 12; indeed, while not shown, transceiver 16 may be spatially affixed above either or both of cell 12 and coupler 14, via wire bonding, flip chip, or other packaging techniques.

Turning now in more detail to coupler 14 in FIG. 4, in an example embodiment, illustrated in FIG. 4, coupler 14 includes two conductors $14_1$ and $14_2$, which preferably have like dimensions and represent mirror-image symmetric structures about an imaginary linear axis $14_{AX}$, but the two are otherwise physically isolated from one another. For example, each of conductors $14_1$ and $14_2$ may be formed by fabrication techniques which, by way of example, may include processes for patterning and affixing metallic surfaces atop a layer. For example, the layer may be glass, with a common ground metallization below the entirety of coupler 14. Further, such formation facilitates fabrication as well as signal coupling between the conductors. Particularly, the full 100% energy of the TX signal from transceiver is preferably connected to a first end $14_{2E1}$ of conductor $14_2$, while a second end $14_{2E2}$ of conductor $14_2$ is connected to the pump antenna $ANT_{TXPUMP}$. Meanwhile, a low voltage signal, such as ground, is connected to a first end $14_{1E1}$ of conductor $14_1$, while a second end $14_{1E2}$ of conductor $14_2$ is connected to the probe antenna $ANT_{TXPROBE}$. In this configuration, a portion of the TX signal energy is coupled, for example capacitively, inductively, or through other manner, from conductor $14_2$ to conductor $14_1$, where preferably those conductors are dimensioned, positioned, and otherwise coupled so that approximately 90% of the energy of the TX signal remains in conductor 142, while 10% of the energy of the TX signal is coupled to conductor $14_2$. Thus, consistent with earlier discussions, the pump antenna $ANT_{TXPUMP}$ provides an energy $E_2$ of 90% of the TX signal in a first direction through cell 12, while the probe antenna $ANT_{TXPROBE}$ provides an energy E1 of 10% of the TX signal in a second direction, opposite the first, through cell 12. Lastly in connection with the construction of coupler 14, note that preferably the linear distances along which the pump and probe signals are to propagate are all preferably integer multiples of ½ of the wavelength of the RF signal to be propagated through cell 12. For example, FIG. 4 illustrates dimensions $DM_1$ and $DM_2$, as linear structural paths for wave propagation, that is, each linear path is a segment of the total propagation path, where the segment is linear for the respective path. Such dimensions are likewise preferable for other like linear paths in coupler 14, namely, dimensioned in accordance with this stated proportionality relative to the RF signal wavelength.

Figure 5:
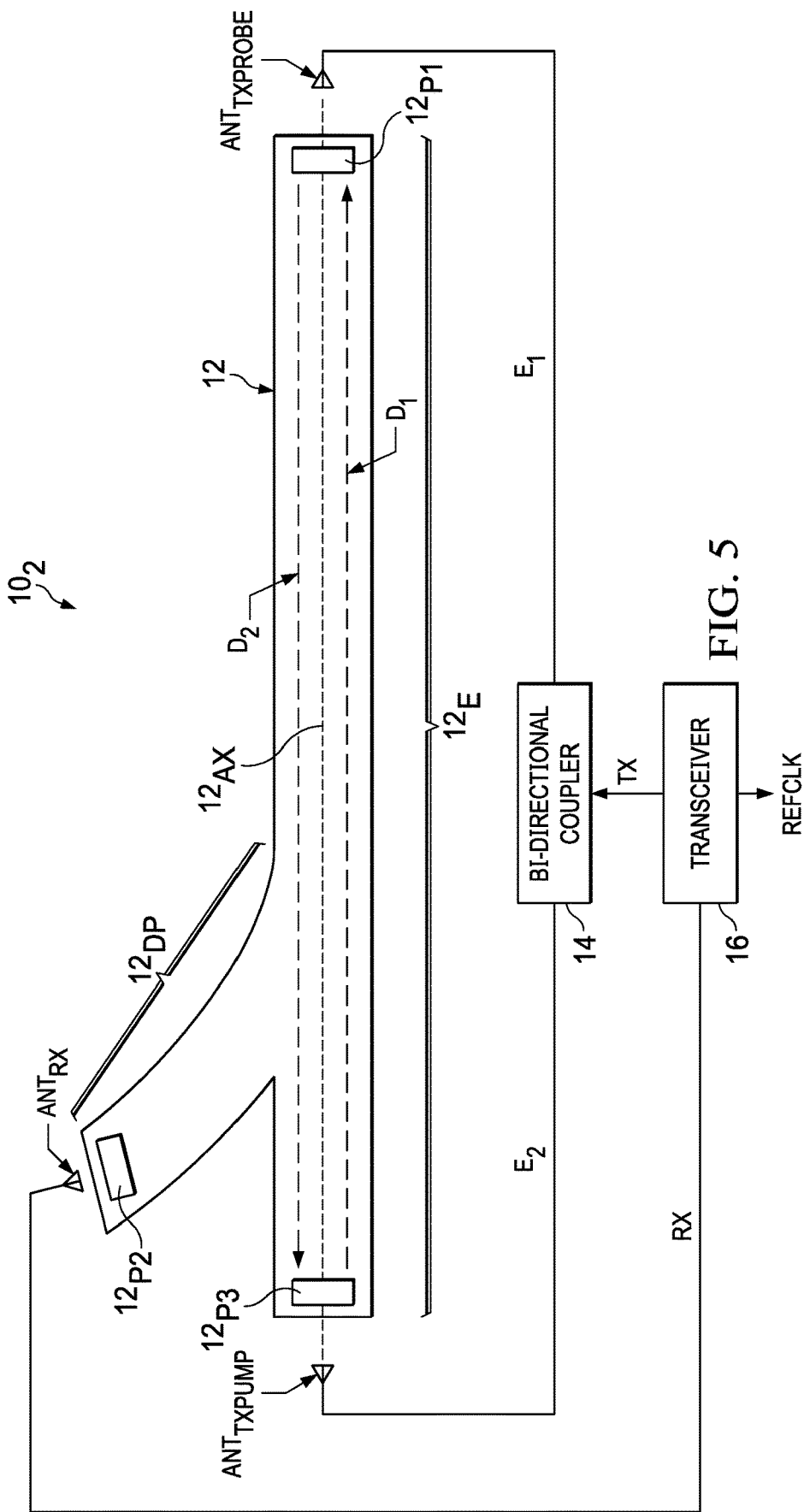
FIG. 5 illustrates a schematic diagram of an alternative example embodiment clock system with pump and probe signals at respective longitudinal ends of the cell cavity.

FIG. 5 illustrates a schematic diagram of an alternative example embodiment clock system 102, which in various ways should be understood by one skilled in the art given the earlier discussion, and the reader is assumed familiar with that discussion (also, transceiver 16 is shown in a simplified view). Where system $10_2$ differs from system $10_1$ is the positioning of certain antennas relative to the second and third passages $12_{P2}$ and $12_{P3}$ of cell 12. Particularly, in system 102, while the probe antenna $ANT_{TXPROBE}$ remains proximate first passage $12_{P1}$, the other two antennas are switched in location, that is, the RX antenna $ANT_{RX}$ is proximate second passage $12_{P2}$ and the pump antenna $ANT_{TXPUMP}$ is proximate third passage $12_{P3}$. In this manner, the bidirectional or counter-propagating signals will pass along the entirety $12_E$ of axis $12_{AX}$, as opposed to only a majority portion $12_M$ thereof as was the case for system $10_1$. However, for system $10_2$, the receive antenna passage ($12_{P2}$) is no longer co-linear with axis $12_{AX}$, but instead the signal is received and communicated to transceiver 16 from the non-axial departure $12_{DP}$ portion of cell 12.

Figure 6:
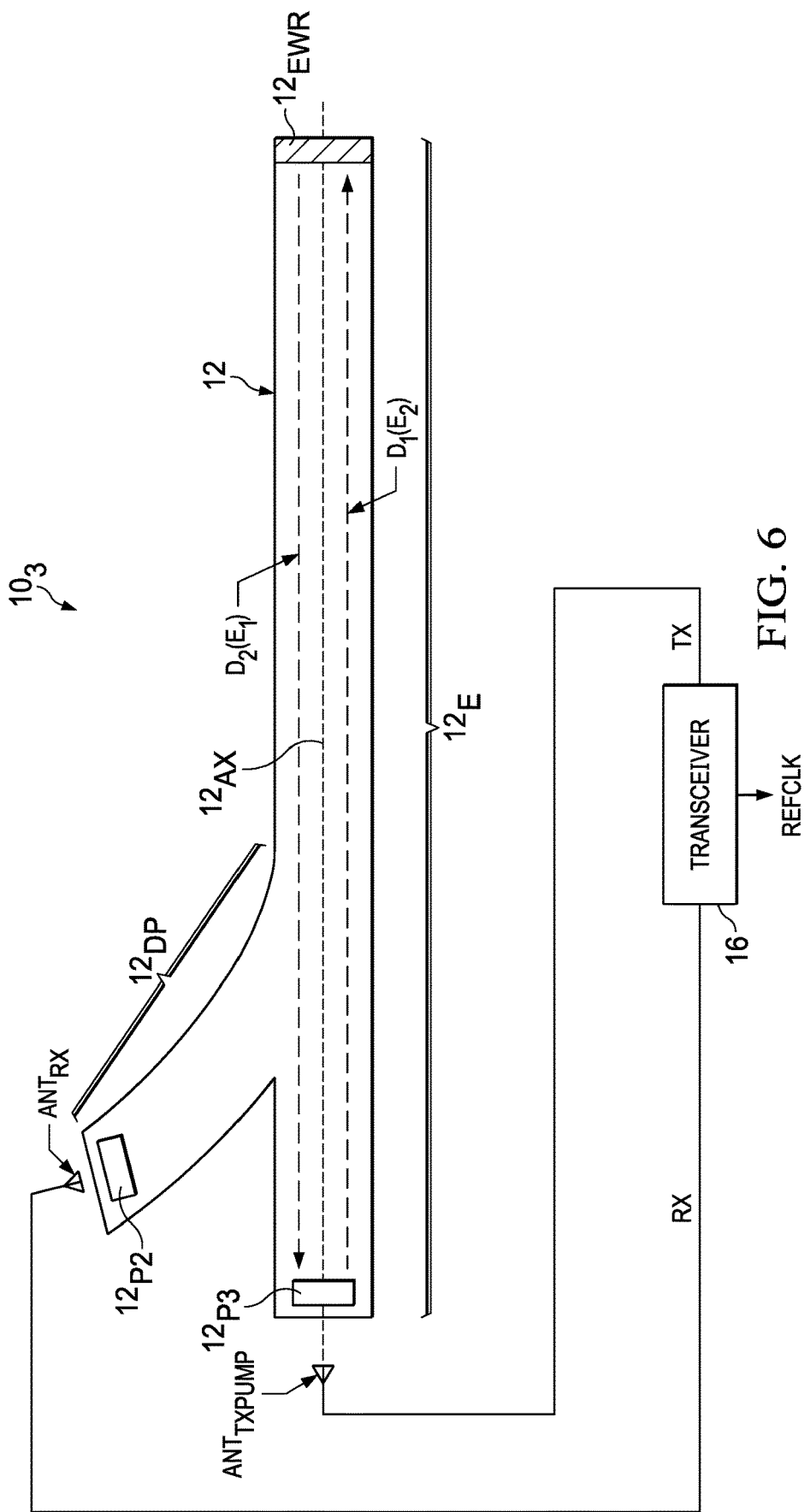
FIG. 6 illustrates a schematic diagram of an alternative example embodiment clock system with a reflector at an opposing end of the cell cavity relative to the pump signal entrance to the cavity.

FIG. 6 illustrates a schematic diagram of an alternative example embodiment clock system 103, which again shares various attributes with earlier embodiments. Where system $10_3$ differs from system $10_2$, however, is the elimination of an external probe transmit antenna (see, e.g., $ANT_{TXPROBE}$ in systems $10_1$ and $10_2$) and of its respective passage $12_{P1}$ (see, FIGS. 1 and 5), such that electromagnetic waves are communicated into cell 12 by only a single transmit antenna $ANT_{TX}$, so system $10_2$ does not include two separate, albeit different energy level, transmitters and corresponding transmission passages into the cell. Instead, transceiver 16 directly couples a TX signal, without an intermediate coupler (see, e.g., coupler 14 of FIG. 1), to a transmit antenna $ANT_{TX}$. Further, the single transmit antenna $ANT_{TX}$ is proximate a passage $12_{P3}$ of cell 12. Further, while cell 12 still includes a passage $12_{P3}$ at a first longitudinal end of the linear pathway in the cell, at an opposing second longitudinal end is located an electromagnetic wave reflector $12_{EWR}$. Given this difference and the earlier discussion, note that when the pump antenna $ANT_{TXPUMP}$ transmits energy into passageway $12_{P3}$ as an entrance into cell 12, that energy proceeds in direction $D_1$ from the first longitudinal end of the linear pathway toward the second longitudinal end of the linear pathway, where a portion of that energy is reflected toward the first longitudinal end of the linear pathway, that is, back along direction $D_2$. Moreover, in this example embodiment, reflector $12_{EWR}$ is structured (e.g., by material, shape, dimension and the like) so as to reflect a considerably reduced energy $E_1$ of energy, as compared to the level of energy $E_2$ received from pump antenna $ANT_{TXPUMP}$. Accordingly, and consistent with earlier example embodiments, such reflection may be that energy $E_1$ provides approximately 10% of the total energy received by cell 12 from the TX signal. The remaining structure and operation of cell 103, however, is readily comparable to other aspects already described.

Figure 7:
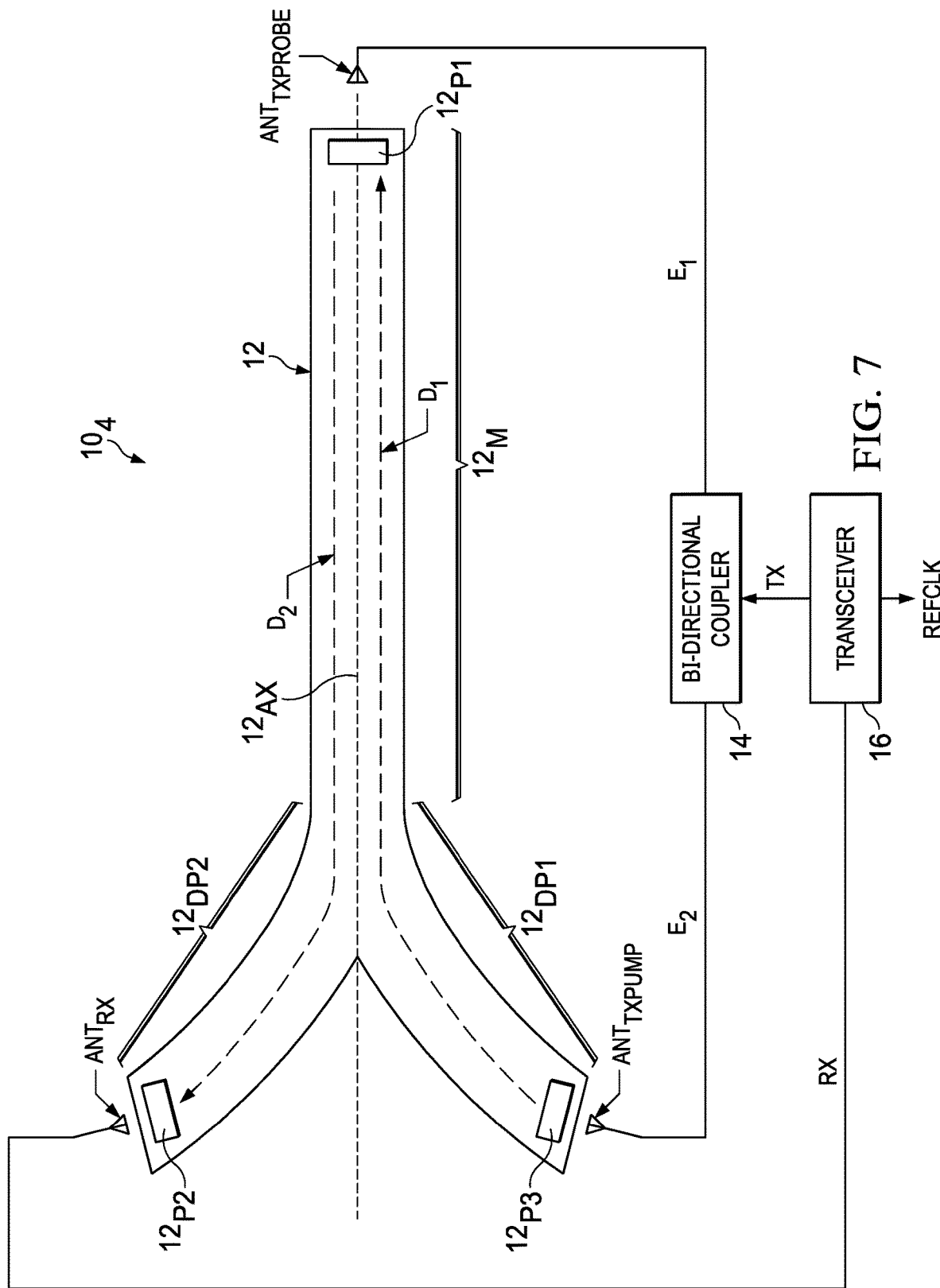
FIG. 7 illustrates a schematic diagram of an alternative example embodiment clock system with both the pump signal and receive signal passages departing away from the longitudinal axis of the cell cavity.

FIG. 7 illustrates a schematic diagram of an alternative example embodiment clock system 104, again which in various ways should be understood by one skilled in the art given the earlier discussion and with various commonality with other example embodiments. Where system $10_4$ differs is that cell 12 is symmetric about its axis $12_{AX}$, in that it includes a longitudinal cavity across a majority $12_M$ of its overall length, but it has equally shaped and sized departure cavity portions $12_{DP1}$ and $12_{DP2}$, each with a respective passage $12_{P3}$ and $12_{P2}$, for communicating respective electromagnetic signals between cell 12 and the pump antenna $ANT_{TXPUMP}$ and RX antenna $ANT_{RX}$, respectively. The majority length longitudinal cavity supports an area where the pump and probe signal coexist and where the zero velocity molecules are detected and contribute to the strength of the signal. Hence, the longer this section, the larger the signal, contributing to a better SNR.

Figure 8:
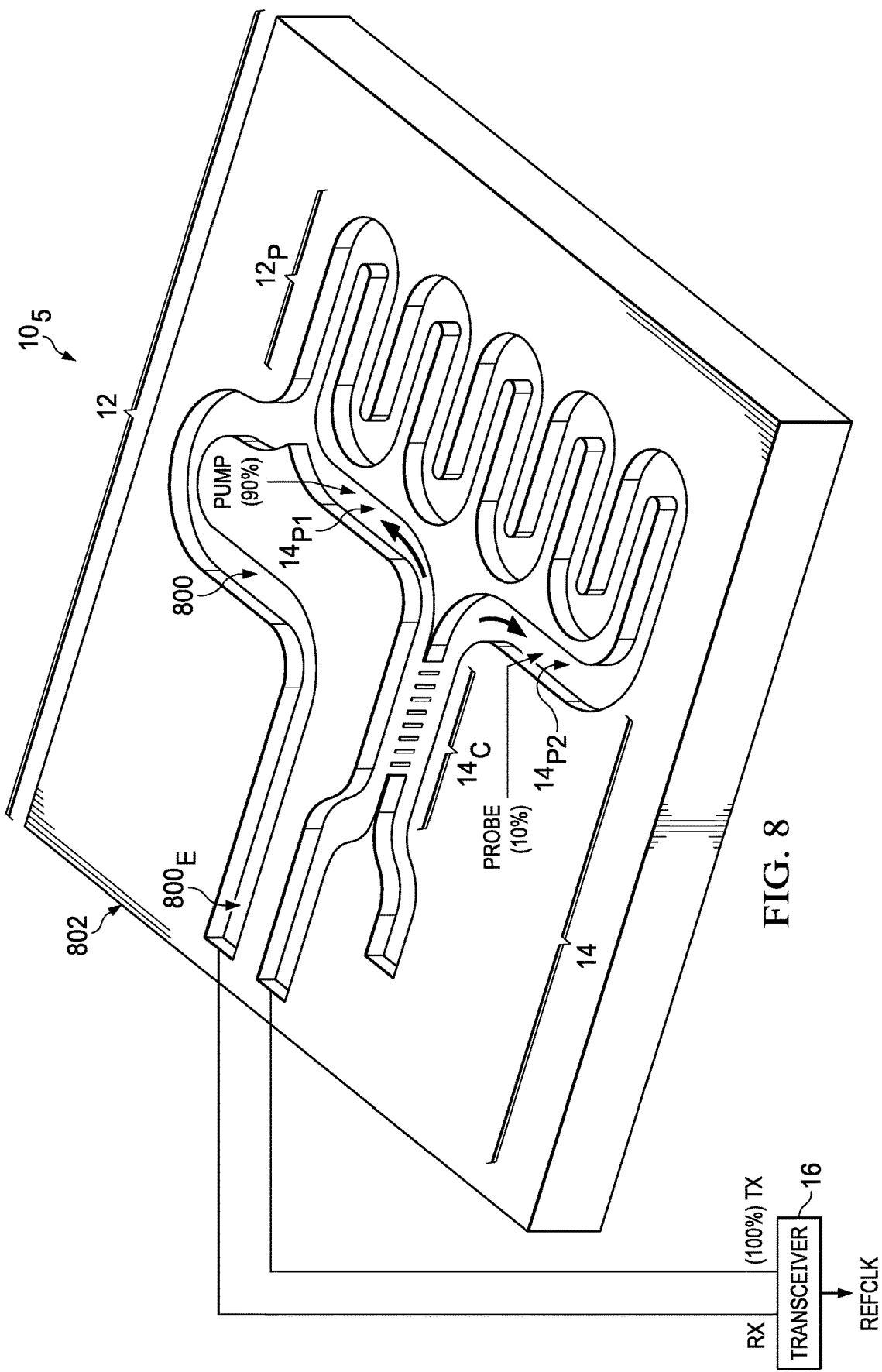
FIG. 8 illustrates a schematic and perspective diagram of an example embodiment configuration for a monolithically integrated bidirectional coupler and cavity.

FIG. 8 illustrates an electrical block and perspective diagram of an alternative example embodiment clock system $10_5$, in which a channel 800 is formed as a recessed path in a substrate 802, whereby channel 800 includes portions that are comparable in certain respects to cell 12 and coupler 14 of earlier embodiments. Accordingly, cell 12 and coupler 14 are monolithically integrated into a same layer in substrate 802 (e.g., co-planar), as now described. Particularly, channel 800 includes various portions, which are generally indicated with brackets so as to illustrate functionality, but in the illustrated example the entire channel 800 functions as a gas cell, that is, a sealed enclosure for storing atoms to be interrogated by an electromagnetic wave. In this regard, while not shown, an additional layer (e.g., glass) is disposed atop an upper surface of substrate 802, thereby enclosing the sealed gas while also allowing receipt of a TX signal from transceiver 16 and providing a path for wave propagation after which the signal provides an RX signal back to transceiver 16. In one portion of channel 800 shown generally by the bracket and coupler reference of 14, there are two proximate wave paths $14_{P1}$ and $14_{P2}$ that are in fluid communication with one another, with a sidewall aperture coupler $14_C$ portion in which a number of apertures are formed between the two paths; in this manner, as TX energy enters channel 800, a first portion (e.g., pump at 90%) of that energy passes through path $14_{P1}$ and the remaining portion (e.g., probe at 10%) of that energy passes through the apertures in sidewall aperture coupler $14_C$ and then through path $14_{P2}$. Paths $14_{P1}$ and $14_{P2}$ continue to, and are also in fluid communication with, opposing ends of a meandering cell portion $12_P$. Accordingly, in cell portion $12_P$, as was the case in earlier embodiments, bidirectional interrogation occurs as the pump wave passes in a first direction through portion $12_P$, while the probe wave passes in a second direction, opposite the first direction, also through portion $12_P$, thereby bidirectionally interrogating dipolar gas in portion $12_P$. Finally, some of the energy of the propagating wave is able to pass from portion $12_P$, back to transceiver 16, in the form of the RX signal from an end $800_E$ of channel 800.

Figure 9:
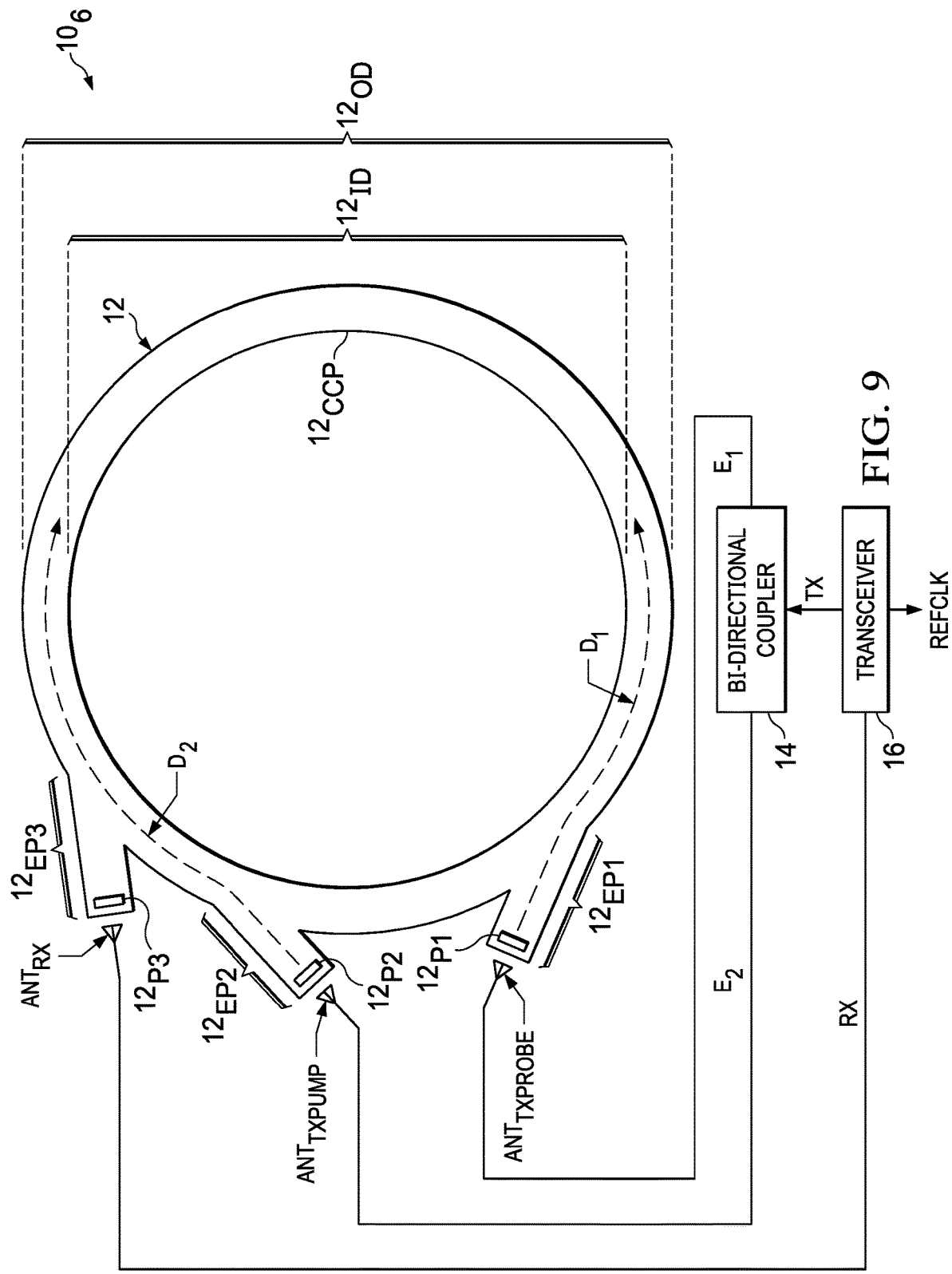
FIG. 9 illustrates a schematic diagram of an alternative example embodiment with a circulating path and bidirectional travel of electromagnetic waves interrogating the dipolar gas.

FIG. 9 illustrates a schematic diagram of an alternative example embodiment clock system $10_6$, which in various ways should be understood by one skilled in the art given the earlier discussion, and the reader is assumed familiar with that discussion (again, transceiver 16 is shown in a simplified view). Also in general, system $10_6$ operates according to method 30 shown in FIG. 3. Where system $10_6$ differs from earlier example embodiments, however, is that cell 12 includes a continuous chamber portion $12_{CCP}$, in which electromagnetic waves may enter cell 12 and continue to circulate to return toward, and then again pass beyond, a point at which they entered the chamber, as is now further explored. First, as with system $10_1$, system $10_6$ again includes a probe antenna $ANT_{TXPROBE}$ proximate a first passage $12_{P1}$, a pump antenna $ANT_{TXPUMP}$ proximate a second passage $12_{P2}$, and an RX antenna $ANT_{RX}$ proximate a third passage $12_{P3}$. However, each of those passages is in a respective extension portion of cell 12, shown as portions $12_{EP1}$, $12_{EP2}$, and $12_{EP3}$. In an embodiment, each of extension portions $12_{EP1}$, $12_{EP2}$, and $12_{EP3}$ is in fluid communication with continuous chamber portion $12_{CCp}$. An alternative embodiment may maintain the gas solely (or predominantly) in the continuous chamber portion $12_{CCP}$, but this will require some type of hermetic window between the extension portions and the circular portion. Such a window would introduce losses in the signal path and potential undesirable reflections, degrading device performance.

In system $10_6$, an electromagnetic signal is transmitted from $ANT_{TXPROBE}$, via first passage $12_{P1}$ into cell 12, that signal propagates as a wave along the interior of extension portion $12_{EP1}$ in a direction $D_1$, and it continues into continuous chamber portion $12_{CCP}$ so that direction $D_1$ thereby can be characterized as counterclockwise in FIG. 9. Due to the continuous nature of portion $12_{CCP}$, however, which in the illustrated example is by way of a circular cross-section when sectioned across a plane along the direction of the circulation around the entire structure, then as the wave passes 360 degrees it will reach the point at which it entered into the circular region, that is, where extension portion $12_{EP1}$ communicates with the circular portion of cell 12, and then continue onward to again circulate in the counterclockwise direction $D_1$. Similarly, but in an opposite direction, as an electromagnetic signal is transmitted from $ANT_{TXPUMP}$, via second passage $12_{P2}$, into cell 12, that signal also propagates as a wave along extension portion $12_{EP2}$, but in a direction $D_2$, opposite that of $D_1$, and thus in chamber continuous portion $12_{CCP}$ at which point the direction $D_2$ is clockwise in FIG. 9. Further, again the continuous nature of portion $12_{CCP}$ facilitates an ongoing circulation of the wave, so that as it passes 360 degrees through cell 12 it will reach the point at which it entered into the circular region, that is, where extension portion $12_{EP2}$ communicates with the circular portion of cell 12, and then continue onward to again circulate in the clockwise direction $D_2$.

The number of wave circulations facilitated in an example embodiment, may repeat a number of times, effectively providing a wave interrogation of the dipolar gas molecules along an effective length far in excess of a single path interrogation along the circumference of portion 12CCP.

The number of circulations will be a function primarily of the quality factor of the cavity (not to be confused with the quality factor of the quantum absorption). The quality factor of an electromagnetic cavity is defined by the ratio of energy stored in the resonator to the energy supplied to it. Accordingly, the more efficient (better performing) the walls of the cavity in communicating the wave through the cavity, the better will be the confinement and the better will be the quality factor of the cavity and the larger will be the number of circulations. The circulation number could be even in excess of 100 circulations under resonance conditions, as can be confirmed, for example, by evaluating strength of a given energy signal in the dipolar gas. Also recognized, however, is that a detrimental effect may occur if the cavity quality factor is above a particular threshold. In example embodiment methodology, therefore, a cavity may be implemented and tested for a power broadening effect, as may be detected, for example, from an increase in the width of the quantum transition, reducing the transition quality factor. Such an effect may occur when power applied by the transmitter is increased, or the intensity of the electric field in the cavity reaches high values due to high quality factor of the cavity. Note that increasing power in this regard could be considered an effective way to improve device performance so as to increase SNR, but such power may concurrently diminish the Q of the response curve. And, recalling that Allan deviation is inversely proportional to both SNR and Q of the frequency response curve, then there is a point of diminishing return if SNR is increased by a percentage that exceeds a comparable percentage decrease in Q that was caused by the SNR increase—in other words, optimum performance is achieved in the exemplary embodiments by maximizing the product of SNR and Q. Hence, in an exemplary embodiment, a cell design may be created and tested at increasing levels of TX energy, and if it is found that an increased signal energy is causing too much power broadening so as to undesirably reduce Q beyond an acceptable level, then that effect may be reduced by diminishing the quality factor of the cell design. Example embodiments to accomplish such quality factor reduction may be achieved by making the walls of the cavity less efficient, for example by making adding roughness to the walls or using higher resistivity metals (e.g., switching from gold to aluminum) Example embodiments include a roughness of 500 Angstroms, but alternatives are contemplated with a roughness greater than 500 Angstroms, and up to 2 micrometers.

Given the structure of system $10_6$, note that as waves circulate as has been described, a portion of the energy will exit the circular cross-sectioned portion of cell 12, via extension portion $12_{EP3}$, to third passage $12_{P3}$, and a portion of that energy is thereby communicated to antenna $ANT_{RX}$ and then be received by transceiver 16, consistent with earlier-described embodiments. However, the nature of a continuous passage causes the remaining energy of the wave to continue to circulate multiple times through the passage, thereby providing additional energy opportunities to interrogate the dipolar gas cells within cell 12. As a result, the number of molecules interrogated is increased, thereby improving the SNR performance as compared to a single-pass interrogation system, and advancing toward near saturation operation. Moreover, by using a pump and probe architecture, the system provides a Doppler free transition.

In another aspect of system 10₆, in an example embodiment, the shape and dimensions of cell 12, and particularly its chamber continuous portion 12$_{CCP}$, are preferably selected to facilitate resonance of the wave passing therethrough and to circulate a number of times. For example, FIG. 9 illustrates the circular portion outer diameter 12$_{OD}$ and inner diameter 12$_{ID}$. These two dimensions are preferably selected to achieve a waveguide suitable for the band of interest (e.g., the WR-5 band of 140-220 GHz). Further, for the specific operating frequency, a propagating wave will exhibit a specific guided wavelength, $\lambda_g$, inside the waveguide and that can be different from unguided waves, and $\lambda_g$ can be determined experimentally or through computer simulations. Given these parameters, and in order to provide beneficial energy for interrogating the dipolar gas, in an example embodiment the diameter of chamber continuous portion 12$_{CCP}$ is dimensioned according to the following Equation 1:

$$D_m = \frac{N\lambda_g}{\pi} \quad \text{Equation 1}$$

where, $D_m$ is the middle diameter of portion 12$_{CCP}$, that is, the distance halfway between outer diameter 12$_{OD}$ and inner diameter 12$_{ID}$ (i.e., $D_m=(12_{OD}+12_{ID})/2$);

N is an integer of 1 or greater; and $\lambda_g$ is the above-introduced guided wavelength of the wave through chamber continuous portion 12$_{CCP}$.

Thus, with Equation 1 providing for a middle diameter $D_m$ of cell 12, it is anticipated that as the wave circulates repeatedly an integer number of times around chamber continuous portion 12$_{CCP}$ (passing a point from which it earlier entered portion 12$_{CCP}$ started or previously passed), the wave energy will be constructive in phase, so as to provide beneficial signal performance.

Further in connection with FIG. 9, note that the circular nature (when considered in the plane of the FIG. 9) of cell 12 is by way of example, and other continuous paths that permit a wave to circulate as described also are contemplated. For example, the continuous path may lie along an oval or a generic polygon. Also in this regard, Equation 1 defines a diameter $D_m$ as it relates to a circular perimeter for the continuous path, given that a diameter of a circle is its perimeter divided by pi. For the more general case of a continuous path having a perimeter P, Equation 1 may be rewritten as the following Equation 2:

$$P=N\lambda_g \quad \text{Equation 2}$$

Accordingly, for example embodiments with a chamber continuous portion that is non-circular, Equation 2 sets forth a preferred perimeter for that portion. Lastly in connection with FIG. 9, the cross-sectional shape of continuous path 12$_{CCP}$, taken perpendicular to the direction of wave propagation, also may be selected from various shapes. For example, the cross-sectional shape of cell 12 in FIG. 9, perpendicular to direction $D_1$ (or $D_2$) may be square, rectangular, trapezoidal, or still other shapes.

Figure 10:
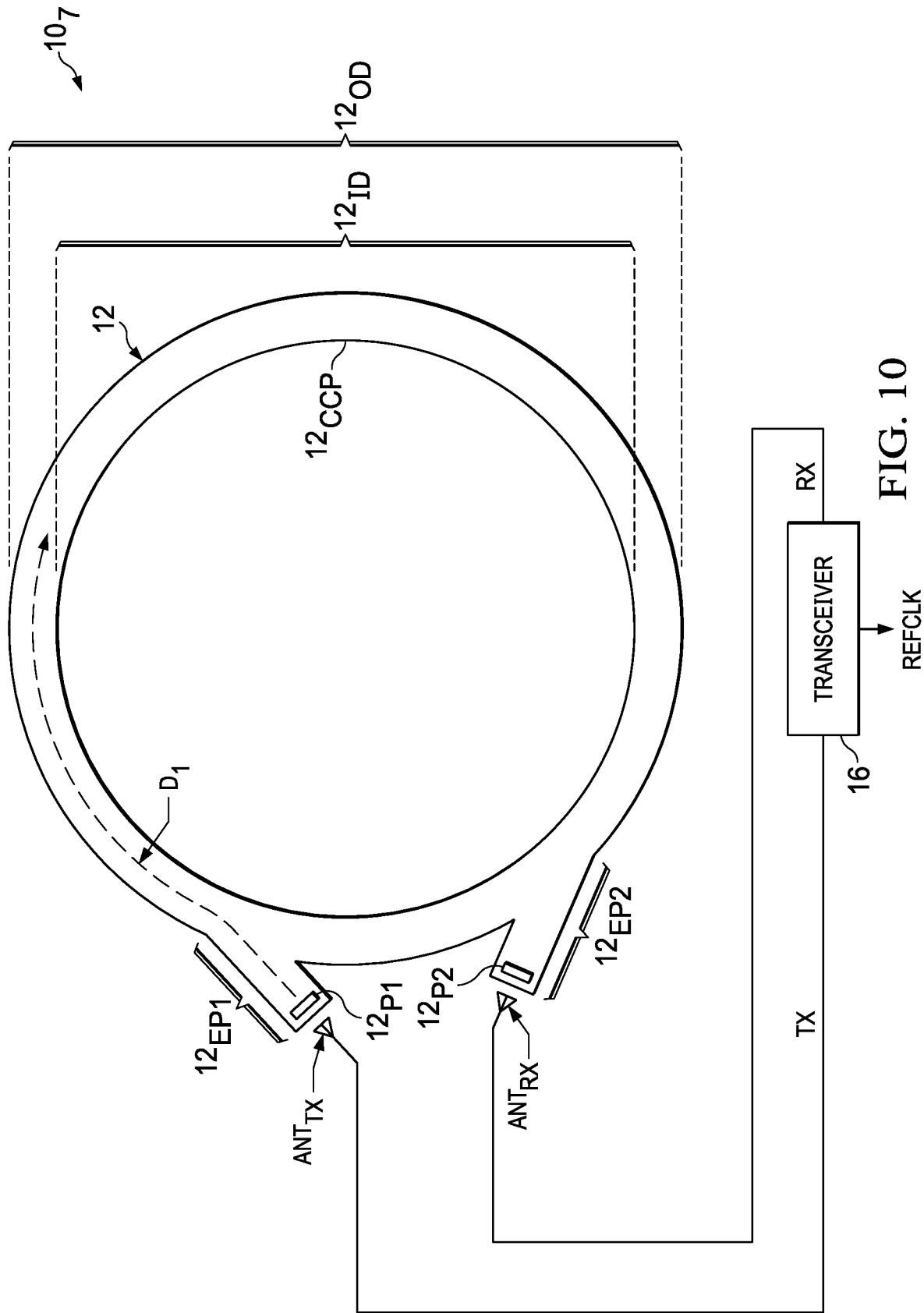
FIG. 10 illustrates a schematic diagram of an alternative example embodiment with a circulating path and unidirectional travel of electromagnetic waves interrogating the dipolar gas.

FIG. 10 illustrates a schematic diagram of an alternative example embodiment clock system 10₇, which in various respects is comparable to system 106 of FIG. 9 and, accordingly, should be understood by one skilled in the art given the earlier discussion. Also in general, system 10₇ operates according to method 30 shown in FIG. 3. Where system 10₇ differs from earlier example embodiments, however, is that electromagnetic waves are communicated into cell 12 by only a single transmit antenna ANT$_{TX}$, so system 107 does not include two separate, albeit different energy level, transmitters and corresponding transmission passages into the cell. Instead, transceiver 16 directly couples a TX signal, without an intermediate coupler (see, e.g., coupler 14 of FIG. 1), to a transmit antenna ANT$_{TX}$. Further, the single transmit antenna ANT$_{TX}$ is proximate a passage 12$_{P1}$ that is located in an extension portion 12$_{EP1}$ of cell 12, where the extension portion, as was the case with system 10₆ of FIG. 9, fluidly communicates with a continuous chamber portion 12$_{CCP}$. Portion 12$_{CCP}$ again is preferably circular in cross-section taken along a plane of wave travel and has a middle diameter $D_1$, as may be established pursuant to the above-described Equation 1. As a result, an electromagnetic signal transmitted from antenna ANT$_{TX}$, via passage 12$_{P1}$ into cell 12, propagates as a wave along the interior of extension portion 12$_{EP1}$ in a direction $D_1$, and it continues into continuous chamber portion 12$_{CCP}$ so that direction $D_1$ thereby can be characterized as clockwise in FIG. 10. Moreover, because of the continuous nature of portion 12$_{CCP}$, and further contributed by the preferred dimension of its middle diameter, the wave will circulate in a constructive manner in cell 12, thereby interrogating an ample amount of dipolar gas in the process. And, such a result is achieved even through the path of the electromagnetic wave is omni-directional, as opposed to the bidirectional signal travel in various embodiments described above. Hence, the response of such interrogation will have an improved SNR as received by transceiver 16, via the exit extension portion 12$_{EP2}$, passage 12$_{P2}$, and receive antenna ANT$_{RX}$.

From the above, various example embodiments provide a system generating frequency clock signals from atomic rotational quantum response in a cell using bidirectional wave interrogation of the cell. Various example embodiments have various respects and/or benefits. For example, Q factor of the system response is improved (increased), thereby correspondingly improving Allan deviation. As still another benefit is that various alterations have been provided, and still others may be ascertained. Accordingly, while various alternatives have been provided according to the disclosed embodiments, still others are contemplated and yet others may be ascertained by one skilled in the art. Given the preceding, one skilled in the art should further appreciate that while some embodiments have been described in detail, various substitutions, modifications or alterations can be made to the descriptions set forth above without departing from the inventive scope, as is defined by the following claims.

From the above, various example embodiments provide a system generating frequency clock signals from atomic rotational quantum response in a cell using a continuous chamber providing a circulating interrogation of the cell. Various example embodiments have various respects and/or benefits. For example, SNR of the system response is improved. As another example, the system may perform well independent of pressure of the (e.g., dipolar) gas stored in the cell. As still another benefit is that various alterations have been provided, and still others may be ascertained. Accordingly, while various alternatives have been provided according to the disclosed embodiments, still others are contemplated and yet others may be ascertained by one skilled in the art. Given the preceding, one skilled in the art should further appreciate that while some embodiments have been described in detail, various substitutions, modifications or alterations can be made to the descriptions set forth above without departing from the inventive scope, as is defined by the following claims.

The invention claimed is:

1. A clock apparatus, comprising:
   a gas cell including a sealed interior, the gas cell configured to provide a signal waveguide;
   a first apparatus configured to provide a first electromagnetic wave to travel in the sealed interior and along a first direction;
   a second apparatus configured to provide a second electromagnetic wave to travel in the sealed interior and along a second direction opposite the first direction;
   a dipolar gas inside the sealed interior; and
   transceiver apparatus comprising receiving apparatus, the receiving apparatus configured to detect an amount of energy in the second electromagnetic wave after the second electromagnetic wave passes through the dipolar gas, and the transceiver apparatus configured to:
   sweep a frequency of an energy signal across a range of frequencies, wherein the range is concurrently provided to the first electromagnetic wave and to the second first electromagnetic wave; and
   responsive to detecting a peak energy in the second electromagnetic wave, maintain a frequency of the first and second electromagnetic waves at a frequency corresponding to a frequency at which the peak energy occurred.

2. The clock apparatus of claim 1 wherein the peak energy corresponds to a maximum amount of absorption of the second electromagnetic wave by the dipolar gas.

3. The clock apparatus of claim 1 wherein the peak energy corresponds to a minimum amount of transmission of the second electromagnetic wave through the dipolar gas.

4. A clock apparatus, comprising:
   a gas cell including a sealed interior, the gas cell configured to provide a signal waveguide;
   a first apparatus configured to provide a first electromagnetic wave to travel in the sealed interior and along a first direction;
   a second apparatus configured to provide a second electromagnetic wave to travel in the sealed interior and along a second direction opposite the first direction;
   a dipolar gas inside the sealed interior; and
   receiving apparatus configured to detect an amount of energy in the second electromagnetic wave after the second electromagnetic wave passes through the dipolar gas;
   in which: the sealed interior includes a linear axis; the second apparatus includes an antenna proximate a first end of the linear axis; and the receiving apparatus includes an antenna proximate a second end, opposite of the first end, of the linear axis.

5. The clock apparatus of claim 4 wherein the first apparatus includes an antenna proximate an end of the cavity that is non-co-linear from the linear axis.

6. A clock apparatus, comprising:
   a gas cell including a sealed interior, the gas cell configured to provide a signal waveguide;
   a first apparatus configured to provide a first electromagnetic wave to travel in the sealed interior and along a first direction;
   a second apparatus configured to provide a second electromagnetic wave to travel in the sealed interior and along a second direction opposite the first direction;
   a dipolar gas inside the sealed interior; and
   receiving apparatus configured to detect an amount of energy in the second electromagnetic wave after the second electromagnetic wave passes through the dipolar gas;
   in which: the sealed interior includes a linear axis; the first apparatus includes an antenna proximate a first end of the linear axis; and the second apparatus includes an antenna proximate a second end, opposite of the first end, of the linear axis.

7. The clock apparatus of claim 6 wherein the receiving apparatus includes an antenna proximate an end of the sealed interior that is non-co-linear from the linear axis.

8. A clock apparatus, comprising:
   a gas cell including a sealed interior, the gas cell configured to provide a signal waveguide;
   a first apparatus configured to provide a first electromagnetic wave to travel in the sealed interior and along a first direction;
   a second apparatus configured to provide a second electromagnetic wave to travel in the sealed interior and along a second direction opposite the first direction;
   a dipolar gas inside the sealed interior; and
   receiving apparatus configured to detect an amount of energy in the second electromagnetic wave after the second electromagnetic wave passes through the dipolar gas;
   in which: the sealed interior includes a linear axis; the first apparatus includes an antenna proximate a first end of the linear axis; and the second apparatus includes a reflector proximate a second end, opposite of the first end, of the linear axis and within the cavity.

9. The clock apparatus of claim 8 wherein the receiving apparatus includes an antenna proximate an end of the sealed interior that is non-co-linear from the linear axis.

10. A clock apparatus, comprising:
    a gas cell including a sealed interior, the gas cell configured to provide a signal waveguide;
    a first apparatus configured to provide a first electromagnetic wave to travel in the sealed interior and along a first direction;
    a second apparatus configured to provide a second electromagnetic wave to travel in the sealed interior and along a second direction opposite the first direction;
    a dipolar gas inside the sealed interior; and
    receiving apparatus configured to detect an amount of energy in the second electromagnetic wave after the second electromagnetic wave passes through the dipolar gas;
    in which: the sealed interior includes a linear axis; the second apparatus includes an antenna proximate a first end of the linear axis; the first apparatus includes an antenna proximate a second end of the sealed interior that is non-co-linear from the linear axis; and the receiving apparatus includes an antenna proximate a third end of the sealed interior that is non-co-linear from the linear axis.

11. The clock apparatus of claim 10 wherein the second end and third end are symmetric relative to the linear axis.

12. A clock apparatus, comprising:
    a gas cell including a sealed interior, the gas cell configured to provide a signal waveguide;

a first apparatus configured to provide a first electromagnetic wave to travel in the sealed interior and along a first direction;

a second apparatus configured to provide a second electromagnetic wave to travel in the sealed interior and along a second direction opposite the first direction, in which the second electromagnetic wave has less energy than the first electromagnetic wave;

a dipolar gas inside the sealed interior; and receiving apparatus configured to detect an amount of energy in the second electromagnetic wave after the second electromagnetic wave passes through the dipolar gas.

13. The clock apparatus of claim 12 wherein the gas cell is formed using one or more layers of a semiconductor wafer.

14. The clock apparatus of claim 13 wherein:
the first apparatus includes a first conductive strip affixed to a layer that is affixed relative to the semiconductor wafer; and
the second apparatus includes a second conductive strip affixed to the layer that is affixed relative to the semiconductor wafer.

15. The clock apparatus of claim 14 wherein the first conductive strip and the second conductive strip are physically isolated from one another.

16. The clock apparatus of claim 12 wherein the first apparatus and the second apparatus are in fluid communication with the gas cell.

17. The clock apparatus of claim 12 further comprising a substrate, wherein the first apparatus, the second apparatus, and the cell are a monolithic fluid communication structure formed in the substrate.

18. The clock apparatus of claim 12 wherein:
the gas cell is formed using one or more layers of a semiconductor wafer; and
the transceiver is embodied in an integrated circuit located in a fixed position relative to the semiconductor wafer.

19. The clock apparatus of claim 12 wherein the dipolar gas is $H_2O$, $CH_3CN$, $HC_3N$, $OCS$, $HCN$, or $NH_3$.

20. A method of operating a clock apparatus, the apparatus comprising a gas cell, including a sealed interior for providing a signal waveguide, the method comprising:
providing a first electromagnetic wave to travel in the sealed interior and along a first direction;
providing a second electromagnetic wave to travel in the sealed interior and along a second direction opposite the first direction;
detecting an amount of energy in the second electromagnetic wave after the second electromagnetic wave passes through a dipolar gas stored in the sealed interior;
sweeping a frequency of an energy signal across a range of frequencies, wherein the range is provided to the electromagnetic wave; and
responsive to detecting a peak energy in the electromagnetic wave, maintaining a frequency of the electromagnetic wave at a frequency corresponding to a frequency at which the peak energy occurred.

* * * * *